United States Patent
Trinh

(10) Patent No.: US 7,196,952 B1
(45) Date of Patent: Mar. 27, 2007

(54) COLUMN/SECTOR REDUNDANCY CAM FAST PROGRAMMING SCHEME USING REGULAR MEMORY CORE ARRAY IN MULTI-PLANE FLASH MEMORY DEVICE

(75) Inventor: Stephen T. Trinh, San Jose, CA (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 11/295,878

(22) Filed: Dec. 7, 2005

(51) Int. Cl.
*G11C 7/00* (2006.01)

(52) U.S. Cl. .................... 365/200; 365/201; 365/225.7

(58) Field of Classification Search ................ 365/200, 365/201, 225.7
See application file for complete search history.

(56) References Cited

U.S. PATENT DOCUMENTS

| | | | |
|---|---|---|---|
| 5,602,786 A | 2/1997 | Pascucci et al. ............. | 365/200 |
| 5,748,543 A * | 5/1998 | Lee et al. .................... | 365/200 |
| 5,841,709 A | 11/1998 | McClure ..................... | 365/200 |
| 6,246,617 B1 | 6/2001 | Urakawa ..................... | 365/200 |
| 6,462,995 B2 | 10/2002 | Urakawa ..................... | 365/200 |

* cited by examiner

*Primary Examiner*—David Lam
(74) *Attorney, Agent, or Firm*—Schneck & Schneck; Thomas Schneck

(57) ABSTRACT

Programming redundant columns for a multi-plane EEPROM includes identifying a defective memory column during a back-end testing operation to provide redundancy information in the form of the original address for the defective column and the address for corresponding fuse links that are programmed to access a redundant column instead of the defective column. From the address for the corresponding fuse links are provided redundant column word-line select (COL RED WL Select) signals to WL input terminals of a Column Redundancy CAM. From the address for the corresponding fuse links are provided column address decoded COL Address Decoded signals to decoded column address input terminals of the Column Redundancy CAM. All of the fuse links are simultaneously programmed.

20 Claims, 4 Drawing Sheets

Fig._2

COLUMN/SECTOR REDUNDANCY CAM FAST PROGRAMMING SCHEME USING REGULAR MEMORY CORE ARRAY IN MULTI-PLANE FLASH MEMORY DEVICE

TECHNICAL FIELD

The invention relates to flash memory and, more particularly, to a multi-plane Flash memory having column redundancy.

BACKGROUND ART

In the semiconductor manufacturing industry, front-end silicon wafer fabrication operations produce a number of integrated circuit dies, such as memory devices. Back-end operations separate, package, and test individual dies. At wafer sort and after packaging of a memory device, back-end testing of the memory device determines whether any memory cells in the memory device are defective. In a multi-plane flash memory, the memory cells in each plane are tested for operability and any defective memory cells in a particular plane are identified. Fuses are used to map defective memory cells to redundant memory cells. What is needed is a technique for improving programming time of fuse links in a multi-plane Flash memory that are used to provide redundant columns or sectors that are identified during back-end testing.

SUMMARY

To improve programming time for a multi-plane Flash memory device during back-end testing, a method is provided by which a column/sector redundancy array is organized to have all 12 memory cells that store column redundancy information or all 9 memory cells store sector redundancy information programmed into fuse links at one time with a fuse programming time of 10–20 microseconds.

The method includes providing redundancy information in the form of two addresses for each defective column of the multi-plane EEPROM. One address is the original address for the defective column. The other address is for corresponding fuse links that are programmed to access a redundant column instead of the defective column. The address for the corresponding fuse links provides redundant column word-line select (COL RED WL Select) signals to word-line WL input terminals of a Column Redundancy CAM. The address for the corresponding fuse links provides column address decoded COL Address Decoded signals to decoded column address input terminals of the Column Redundancy CAM. The method includes the step of simultaneously programming all of the fuse links using the original address of the defective column such that the fuse links steer data designated for a defective column to a redundant, or replacement.

The method also includes the step of identifying the defective memory column by testing the multi-plane EEPROM during a back-end testing operation to provide redundancy information in the form of two addresses for each defective column of the multi-plane EEPROM. One address is the original address for the defective column and the other address is for corresponding fuse links that are programmed to access a redundant column instead of the defective column.

In one embodiment of the method, the multi-plane EEPROM includes a plurality of memory planes and each memory plane has one or more fuse links that are used to steer data designated for a defective column to a redundant, or replacement, column. The one or more fuse links are on one of the plurality of memory planes. The fuse links are provided as EEPROM cells.

The method further includes the step of associating each plane of the multi-plane memory with a page of the one plane of the plurality of memory planes on which are the one or more fuse links.

The method further includes that each page of the one plane has a number of IO with a number of cells associated with it and wherein a fraction of the cells are used to store redundancy information affecting the plane associated with a page.

The method provides the step of latching the address for the corresponding fuse links into an address buffer, where the address buffer is part of the EEPROM.

The method also provides the step of latching the original address of the defective column into a data input latch, where the data input latch is part of the EEPROM.

The method further includes the step of providing redundant column word-line select (COL RED WL Select) signals to WL input terminals of a Column Redundancy CAM using control logic for decoding and selecting said word-line select (COL RED WL Select) signals.

The method further includes the step of providing column address decoded COL Address Decoded signals to decoded column address input terminals of the Column Redundancy CAM using control logic for decoding and selecting said column address decoded COL Address Decoded signals.

DETAILED DESCRIPTION

Figure 1:
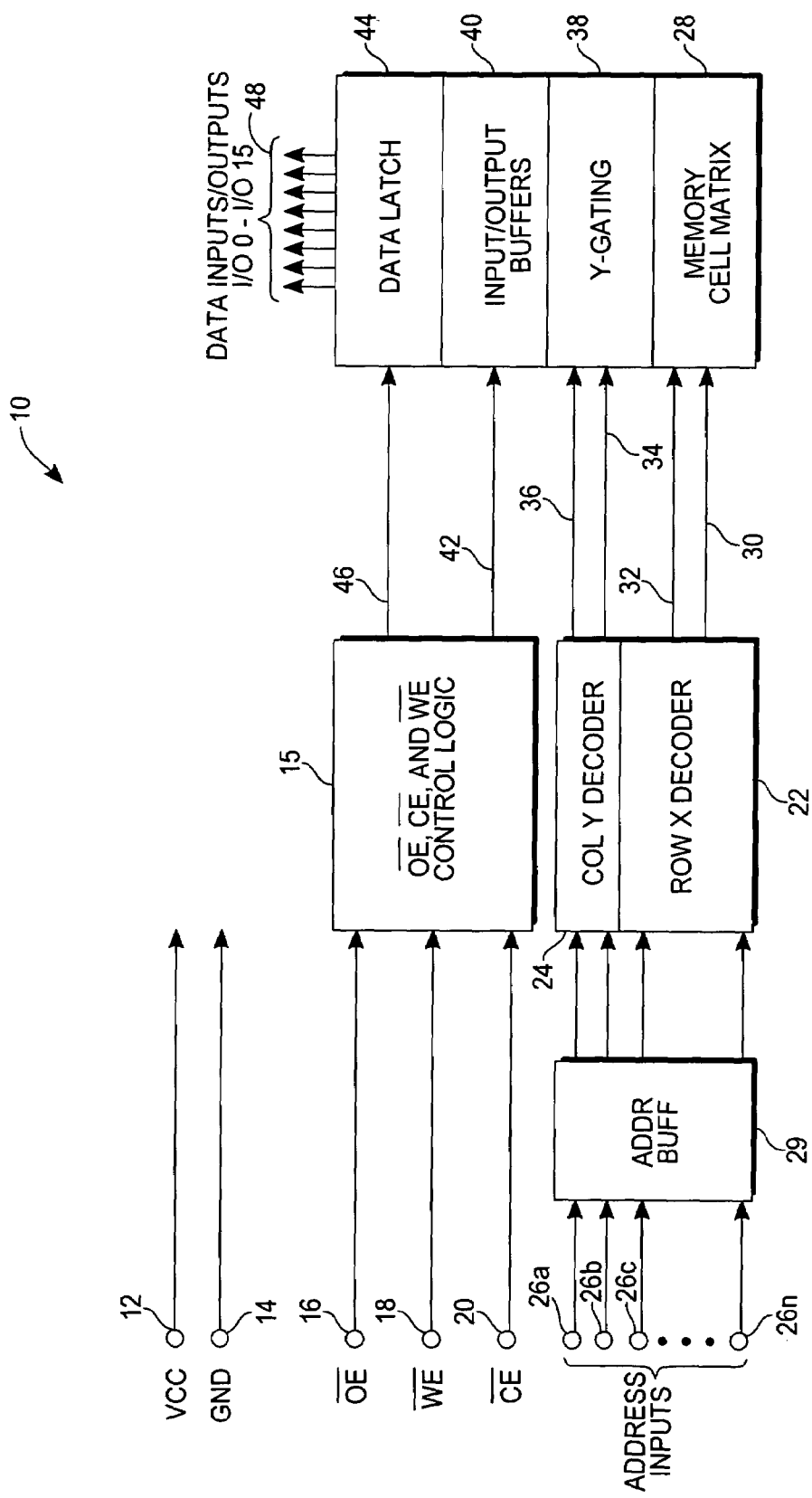
FIG. 1 is a block diagram illustrating the functional blocks of a typical EEPROM in accordance with the present invention.

FIG. 1 shows the functional blocks of an EEPROM 10. Power is provided to the EEPROM 10 through a VCC terminal 12 and a Ground terminal 14. A control signal logic block 15 receives respective output enable $\overline{OE}$, write enable $\overline{WE}$, and chip enable $\overline{CE}$ signals at input terminals 16, 18, 20. A Y Address Decoder circuit 24 and an X Address Decoder circuit 22 receive n input address bit signals at address input terminals 26a, 26b, 26c, . . . , 26n, where n is the number of address bits. Address buffers 29 are used to latch the address signals.

A memory cell matrix 28 stores data in memory cells addressed by the address bit signals. The X address decoder circuit 22 decodes that address signals to provide word line signals on lines 30, 32 that are connected to word line input terminals of the memory cell matrix 28 to select and activate particular rows of memory cells. The Y address decoder circuit 24 provides column access signals on control lines 34, 36 to a Y-Gating circuit 38. The Y gating circuit 38 selects a particular group of 16 columns to be connected to 16 input/output terminals of input/output buffer circuits 40.

The control signal logic block 15 provides a control signal on a line 42 to the input/output buffer circuits 40.

The input/output buffer circuits 40 are connected to a data latch circuit 44 that is controlled with a control signal on a control line 46 from the control signal logic block 15. The data latch circuit 40 has a group of 16 bi-directional data input/output terminals I/O 0–I/O 15 designated by reference numeral 48.

In one particular embodiment of the invention, each IO terminal has 128 memory cells. However, to reduce decoding complexity, only 16 cells in each IO of the memory core are made available to store the redundancy information. Since the column redundancy information is 12 bits wide, only data information in IO 0 to IO 11 are used to program the memory cells. For the sector redundancy case, only data information in IO 0 to IO 8 are used to program the 9 memory cells.

Each plane has 32 extra columns and four of those extra columns are made available to be used as redundant columns in each plane. The columns for redundant sectors are spread out over the various planes. Each one of the planes of the multi-plane memory has four redundant columns that are used to replace any column in that plane that is identified as a defective, or bad, column containing one or more bad memory cells. The redundant columns of each plane are activated by a fuse links provided on a zero order plane using Redundancy Information provided by a back-end test. The Redundancy Information, that is, address of a bad column, allows an address that is directed to a bad address in a particular plane to be redirected to a replacement redundant column. This allows data to be read or written using the redundant column instead of the bad column. In this manner, columns with bad cells suppressed and replaced.

On the falling edge of the write enable signal $\overline{WE}$, the address of a redundant column is latched into the address buffer of the EEPROM 10. On the rising edge of WEB, the address of a corresponding bad column or bad sector is latched in the DATA buffer of the EEPROM 10. This latched information is then programmed into the Flash CAM using a CAM programming pulse. The programmed CAM is then used to scan input addresses for the addresses of bad columns. When the CAM recognizes an address for a bad column, the CAM provides a substitute, or redundant, address to a corresponding replacement redundant column. During the programming pulse, all of the CAM information is set into the CAM on one write cycle, rather than in a series of write cycle. In this manner, factory back-end programming time for multi-plane EEPROM chips is reduced.

Figure 2:
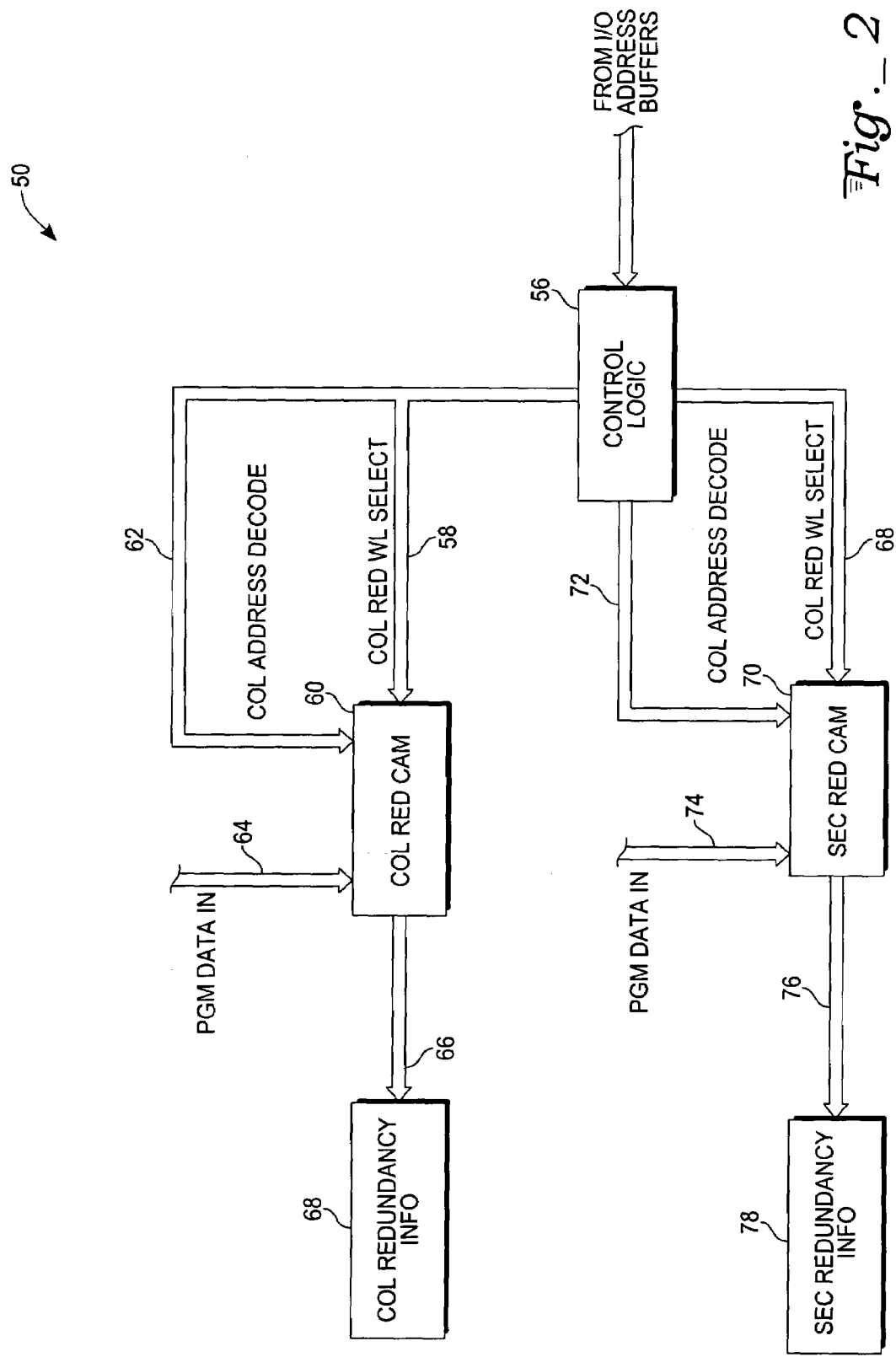
FIG. 2 is a block diagram illustrating functional blocks of a column/sector redundancy scheme that provides fast programming of a CAM that is a further part of the EEPROM of FIG. 1.

FIG. 2 is a block diagram of a column/sector redundancy CAM fast programming system 50 for use with a multi-plane flash memory device such as that illustrated in FIG. 1. This system is provided to avoid storing data in a defective column or sector. This system provides that data is automatically routed to a redundant, or replacement, column or sector having a redundant column or sector address.

Column Redundancy

After a defective column is identified during a back-end testing operation, the back-end testing operation provides two addresses for each defective column. One address is the address for corresponding fuses on the zero order plane. The other address is the original address for the defective column.

On the falling edge of the $\overline{WE}$ signal, the address location for the fuse cells is latched into address buffers 29 of the EEPROM, seen in FIG. 1. A data input latch 44 is presented with the original address of a defective column. On the rising edge of the $\overline{WE}$ signal, the address information for the bad column is latched into a data latch 44 of the EEPROM. The address information for a bad column that is latched in the data latch 44 is then used to program up to four sets of fuses in the zero order plane for up to four corresponding bad columns.

After the address location for the fuse cells is latched into an address buffer 29 (FIG. 1) of the EEPROM, the address location for the fuse cells is presented to a control logic circuit 56, seen in FIG. 2. For each fuse-cell address presented to the control logic circuit 56, the control logic circuit 56 provides redundant column word-line select (COL RED WL Select) signals on a sub-bus 58 to WL input terminals of a Column Redundancy CAM 60. For each redundant column address presented to the control logic circuit 56, the control logic circuit 56 also provides column address decoded COL Address Decoded signals on a sub-bus 62 to decoded column address input terminals of the Column Redundancy CAM 60.

After the address location for the defective column is latched in the data latch 44 (FIG. 1) of the EEPROM, the defective column address is presented to the Column Redundancy CAM 60 on a bus 64 (FIG. 2). The output of the Column Redundancy CAM 60 is provided on a bus 66 to a block 68 that includes fuses in the zero order plane that are programmed with the address of a bad column. The fuses are used to steer data designated for a defective column to a redundant, or replacement, column that is a conventional part of an EEPROM memory array.

Sector Redundancy

If more than four columns are bad in a particular plane, the back-end operation invokes a sector redundancy scheme whereby a whole sector encompassing a number of columns is replaced with a redundant sector. The sector fuses are also provided on the zero order plane and are programmed in a manner similar to the fuses for redundant columns. A smaller number of the 16 IO cells, 9 for example, are used to store redundancy information regarding bad sectors. Upon application of a fuse program pulse a set of fuses for a redundant sector is programmed in the zero order plane.

After a defective sector is identified during a back-end testing operation, the back-end testing operation provides two addresses for each defective sector. One address is the address for corresponding fuses on the zero order plane. The other address is the original address for the defective sector.

On the falling edge of the $\overline{WE}$ signal, the address location for the fuse cells is latched into an address buffer 29 (FIG. 1) of the EEPROM. A data latch 44 is presented with the original address of a defective sector. On the rising edge of the $\overline{WE}$ signal, the address information for the bad sector is latched into the data latch 44 (FIG. 1) of the EEPROM. The address information for the bad sector that is latched in the data latch 44 is then used to program one or more respective fuses in the zero order plane for corresponding bad sectors.

After the address location for the fuse cells for a sector is latched into the address buffer 29 of the EEPROM, the address location for the fuse cells is presented to a control logic circuit 56. For each fuse-cell address presented to the control logic circuit 56, the control logic circuit 56 provides redundant sector word-line select (SEC RED WL Select) signals on a sub-bus 68 to WL input terminals of a Sector Redundancy CAM 70. For each redundant sector address presented to the control logic circuit 56, the control logic circuit 56 also sector address decoded COL Address Decoded signals on a sub-bus 72 to decoded column address input terminals of the Sector Redundancy CAM 70.

After the address location for the defective sector is latched in the data latch 44 of the EEPROM, the defective sector address is presented to the Sector Redundancy CAM 70 on a bus 74. The output of the Sector Redundancy CAM 70 is provided on a bus 76 to a block 78 that includes fuses in the zero order plane that are programmed with the address of a bad sector. The fuses are used to steer data designated for a defective sector to a redundant, or replacement, sector.

Figure 3:
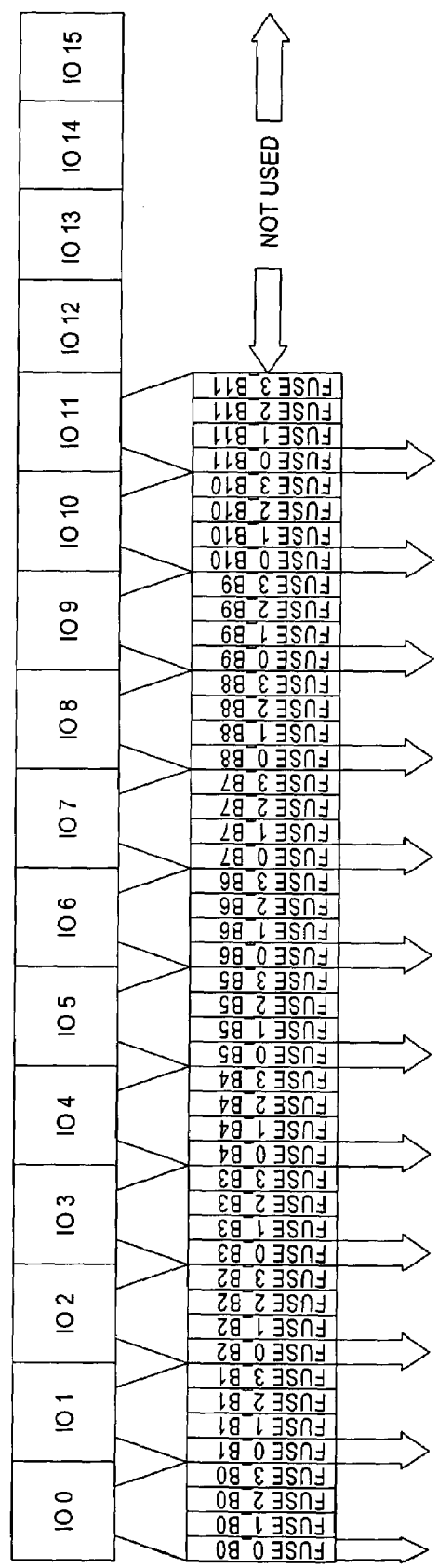
FIG. 3 is a more detailed view of a column redundancy CAM that may be used with the device of FIG. 2.

FIG. 3 illustrates the Col Redundancy CAM 60 shown in FIG. 2. Each plane of a multi-plane memory is associated with a page, or part, of the zero order fuse plane in which the column redundancy information is stored. Each page of the zero order fuse plane has a number of IO, 16 for example. Each IO has a number of cells, 128 for example, associated with it. A fraction of the 128 cells, 16 for example, are used to store redundancy information affecting the plane associated with a page. A number of IO cells, 12 for example, are used to store information regarding bad columns. A smaller number of the 16 IO cells, 9 for example, are used to store redundancy information regarding bad sectors.

Twelve of the I/O of data input latch circuit 44 are loaded with an address of one of four defective column addresses for a given plane. Each I/O can program four different sets of fuses for four different redundant columns. One set of twelve fuses for one redundant column are designated FUSE0_B0 to FUSE0_B11. The other sets of twelve fuses are respectively designated FUSE1_B0 to FUSE1_B11, FUSE2_B0 to FUSE2_B11, and FUSE3_B0 to FUSE3_B11.

Upon application of a fuse program pulse a set of fuses for a redundant column is programmed in the zero order plane. Each of the planes 1 to 31 are provided with four sets of fuses.

Figure 4:
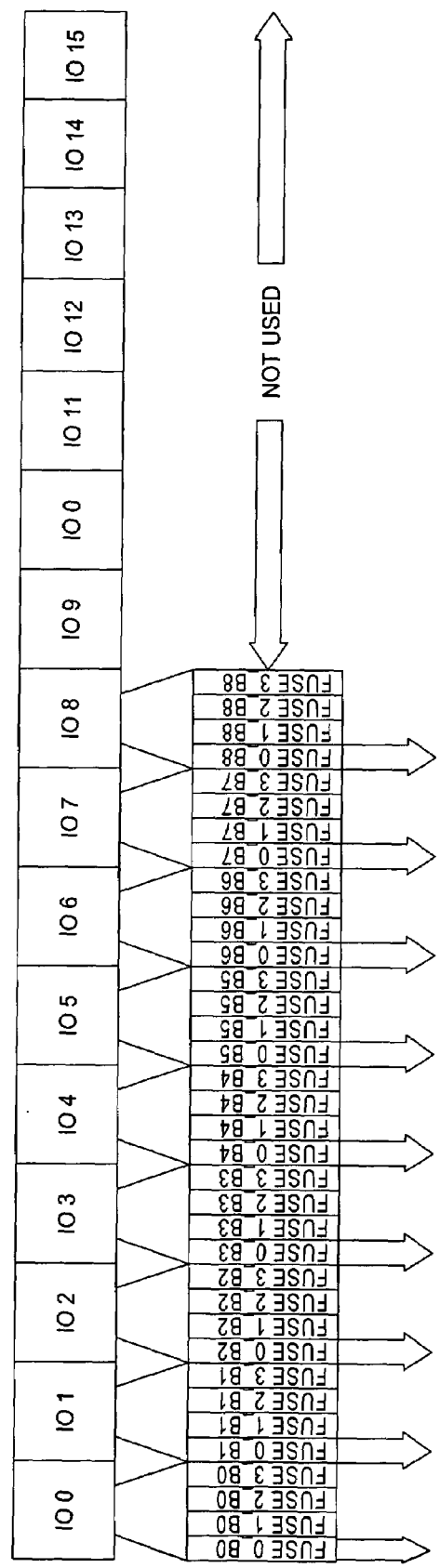
FIG. 4 is a more detailed view of a sector redundancy CAM that may be used with the device of FIG. 2.

FIG. 4 illustrates the Sector Redundancy CAM 70 shown in FIG. 2. If more than four columns are bad in a particular plane, sector redundancy is invoked whereby a whole sector encompassing a number of columns is replaced with a redundant sector. The sector fuses are also provided on the zero order plane and are programmed in a manner similar to the fuses for redundant columns. A smaller number of the 16 IO cells, 9 for example, are used to store redundancy information regarding bad sectors. Upon application of a fuse program pulse a set of fuses for a redundant sector is programmed in the zero order plane. Four sets of fuses are provided for sector redundancy.

To facilitate description of the present invention, an exemplary multi-plane Flash Memory is provided having 32 planes with, for example, 2048 columns in each plane. One of the planes, such as the zero order plane, has redundant columns that are used to replace a columns identified as having one or more bad cells. The zero order plane contains fuse links. The redundant columns in the zero order fuse plan are activated by fuse links in the zero order plane using redundancy information that includes the address of a bad column. The redundancy information allows an address directed to the zero order plane to read or write data only from a redundant column instead of from a bad column. A bad column with one or more bad cells is thereby suppressed.

What is claimed is:

1. A method of programming redundant columns for a multi-plane EEPROM, comprising the steps of:
providing redundancy information in the form of two addresses for each defective column of the multi-plane EEPROM, where one address is the original address for the defective column and the other address is for corresponding fuse links that are programmed to access a redundant column instead of the defective column;
from the address for the corresponding fuse links, providing redundant column word-line select (COL RED WL Select) signals to WL input terminals of a Column Redundancy CAM;
from the address for the corresponding fuse links, providing column address decoded COL Address Decoded signals to decoded column address input terminals of the Column Redundancy CAM; and
simultaneously programming all of the fuse links using the original address of the defective column such that the fuse links steer data designated for a defective column to a redundant, or replacement, column.

2. The method of claim 1 including the step of identifying the defective memory column includes testing the multi-plane EEPROM during a back-end testing operation to provide redundancy information in the form of two addresses for each defective column of the multi-plane EEPROM, where one address is the original address for the defective column and the other address is for corresponding fuse links that are programmed to access a redundant column instead of the defective column.

3. The method of claim 1 wherein the multi-plane EEPROM includes a plurality of memory planes and wherein each memory plane has one or more fuse links that are used to steer data designated for a defective column to a redundant, or replacement, column.

4. The method of claim 3 wherein the one or more fuse links are on one of the plurality of memory planes.

5. The method of claim 4 wherein the fuse links are provided as EEPROM cells.

6. The method of claim 4 including the step of associating each plane of the multi-plane memory with a page of the one plane of the plurality of memory planes on which are the one or more fuse links.

7. The method of claim 6 wherein each page of the one plane has a number of IO with a number of cells associated with it and wherein a fraction of the cells are used to store redundancy information affecting the plane associated with a page.

8. The method of claim 1 including the step of latching the address for the corresponding fuse links into an address buffer.

9. The method of claim 8 wherein the address buffer is part of the EEPROM.

10. The method of claim 1 including the step of latching the original address of the defective column into a data input latch.

11. The method of claim 10 wherein the data input latch is part of the EEPROM.

12. The method of claim 1 wherein the step of providing redundant column word-line select (COL RED WL Select) signals to WL input terminals of a Column Redundancy CAM includes using control logic for decoding and selecting said word-line select (COL RED WL Select) signals.

13. The method of claim 1 wherein the step of providing column address decoded COL Address Decoded signals to decoded column address input terminals of the Column Redundancy CAM includes using control logic for decoding and selecting said column address decoded COL Address Decoded signals.

14. A method of programming redundant columns for a multi-plane EEPROM, comprising the steps of:
identifying a defective memory column including testing the multi-plane EEPROM during a back-end testing operation and providing redundancy information in the form of two addresses for each defective column of the multi-plane EEPROM, where one address is the original address for the defective column and the other address is for corresponding fuse links that are programmed to access a redundant column instead of the defective column;

from the address for the corresponding fuse links, providing redundant column word-line select (COL RED WL Select) signals to WL input terminals of a Column Redundancy CAM;

from the address for the corresponding fuse links, providing column address decoded COL Address Decoded signals to decoded column address input terminals of the Column Redundancy CAM;

simultaneously programming all of the fuse links using the original address of the defective column such that the fuse links steer data designated for a defective column to a redundant, or replacement, column.

15. The method of claim 14 wherein the multi-plane EEPROM includes a plurality of memory planes and wherein each memory plane has one or more fuse links that are used to steer data designated for a defective column to a redundant, or replacement, column.

16. The method of claim 15 wherein the one or more fuse links are on one of the plurality of memory planes.

17. The method of claim 16 wherein the fuse links are provided as EEPROM cells.

18. The method of claim 16 including the step of associating each plane of the multi-plane memory with a page of the one plane of the plurality of memory planes on which are the one or more fuse links and wherein each page of the one plane has a number of IO with a number of cells associated with it and wherein a fraction of the cells are used to store redundancy information affecting the plane associated with a page.

19. The method of claim 14 including the step of:
latching the address for the corresponding fuse links into an address buffer that is part of the EEPROM; and
latching the original address of the defective column into a data input latch.

20. The method of claim 14 wherein the step of providing redundant column word-line select (COL RED WL Select) signals to WL input terminals of a Column Redundancy CAM includes using control logic for decoding and selecting said word-line select (COL RED WL Select) signals; and
wherein the step of providing column address decoded COL Address Decoded signals to decoded column address input terminals of the Column Redundancy CAM includes using control logic for decoding and selecting said column address decoded COL Address Decoded signals.

* * * * *